United States Patent [19]

Klein et al.

[11] 3,745,473

[45] July 10, 1973

[54] MIXER CIRCUIT

[75] Inventors: Gerrit Klein; Karel Elbert, both of Emmasingel, Eindhoven, Netherlands

[73] Assignee: U.S. Philips Corporation, New York, N.Y.

[22] Filed: Mar. 12, 1971

[21] Appl. No.: 123,894

Related U.S. Application Data

[63] Continuation of Ser. No. 715,357, March 22, 1968, abandoned.

[52] U.S. Cl. .................................. 328/133, 328/146

[51] Int. Cl. .................................. H03b 3/04

[58] Field of Search .................................. 328/133, 134; 307/233; 331/25, 37

[56] References Cited

UNITED STATES PATENTS

| | | | |
|---|---|---|---|
| 3,460,044 | 8/1969 | Milenkovic | 328/134 |
| 2,563,816 | 8/1951 | Butman | 328/133 |
| 2,933,682 | 4/1960 | Moulton et al. | 328/133 X |
| 3,094,666 | 6/1963 | Smith | 328/133 X |
| 3,187,195 | 6/1965 | Stefanov | 328/133 X |

*Primary Examiner*—Roy Lake
*Assistant Examiner*—James B. Mullins
*Attorney*—Stanley I. Laughlin

[57] ABSTRACT

A mixing circuit avoids the production of image frequencies by producing pulses corresponding to the times two input waves have the same instantaneous amplitude and sign of the product of the signs of their time derivatives is constant. The pulses control a trigger circuit, and the output of the trigger circuit is filtered.

4 Claims, 4 Drawing Figures

Figures 1, 3, 4:
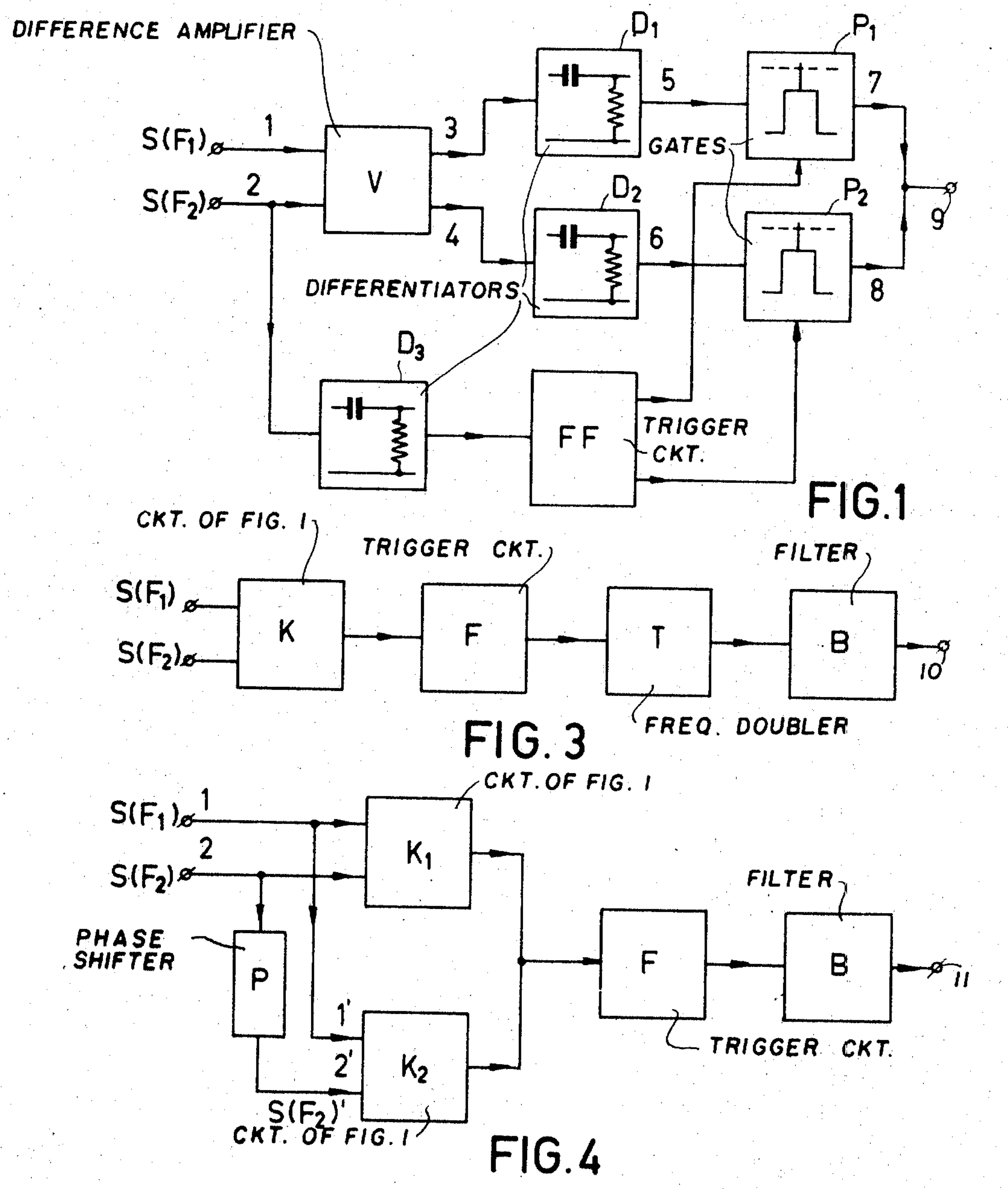

INVENTORS
GERRIT KLEIN
KAREL E. KUIJK
BY
Frank R. Trifari
AGENT

INVENTORS
GERRIT KLEIN
KAREL E. KUIJK
BY
Frank R. Trifari
AGENT

MIXER CIRCUIT

This application is a continuation of application Ser. No. 715,357, filed Mar. 22, 1968, now abandoned.

The invention relates to an arrangement for mixing two electric input signals without the production of an image frequency. A known arrangement of this kind includes a transistor which is connected as an amplifier and the collector circuit of which includes a band-pass filter. One input signal is applied to the base and the other to the emitter of the transistor. Owing to the non-linearity of the collector current/base-emitter voltage characteristic of the transistor mixed signals are produced in the collector circuit which have frequencies equal to, or integral multiples of, the sum or the difference of the frequencies of the two input signals. The desired mixed signal, for example the signal at the sum frequency, is obtained by means of the band-pass filter which is included in the collector circuit of the transistor and which does not pass the remaining frequencies, especially the image frequency (in the example chosen the difference frequency).

Thus, a mixed signal containing substantially no image frequency may be derived from the output of the band-pass filter.

However, this mixer circuit has the disadvantage that in the case of a large difference between the frequencies of the input signals the relative bandwidth of the band-pass filter must be very small. Consequently the filter has to satisfy very exacting tolerance requirements.

In the arrangement according to the invention, the said didsadvantages substantially do not occur because it enables two electric signals to be mixed so as to produce either only the difference or an integral multiple of the difference or only the sum or an integral multiple of the sum of the frequencies of the two input signals.

The arrangement in accordance with the invention is characterized in that the two input signals are applied to a selective comparator device which responds at the instants at which the instaneous values of the two input signals are equal but which from these instants selects those at which the product of the derivatives of the two input signals in time always has the same sign, and delivers an output signal only at these selected instants.

The comparator device may contain a difference amplifier which also acts as a limiter and to the two inputs of which the two electric input signals are applied. At the two outputs of the difference amplifier square-wave voltages are produced the edges of which are determined by the instants at which the instantaneous value of the two input signals are equal. Each of the two square-wave voltages is then applied through a differentiator to the input of an associated gate circuit, the control inputs of the two gates being connected each to one output of a trigger circuit to the control input of which the input at the lower frequency is applied through a differentiator. The outputs of the two gates are directly connected to one another and also form the output of the arrangement in accordance with the invention.

The invention is based on the principle that when in respect of two sinusoidal or triangular signals having substantially equal maximum and minimum instantaneous values but different frequencies the instants are determined at which the instantaneous values of the two signals are equal and at which also the derivatives of the two signals in time have equal signs, these instants succeed one another at intervals which vary inversely as the difference frequency of the two signals. By using the said instants for controlling a trigger circuit, symmetrical square-wave voltages are obtainable which have repetition frequencies proportional to the difference of the frequencies of the two input signals. The instants at which the instantaneous values of the two signals are equal and also the derivatives of the two signals in time have opposite signs succeed one another at intervals inversely proportional to the sum frequency of the two signals. By using the said instants to control a trigger circuit symmetrical square-wave voltages are obtainable which have repetition frequencies proportional to the sum of the frequencies of the two input signals. By a simple filtering process the desired sine oscillation may be obtained from the square-wave voltage. The requirements to be satisfied by the filter are considerably less stringent, since now only the harmonics of the desired mixed frequency have to be filtered out.

Figure 2:
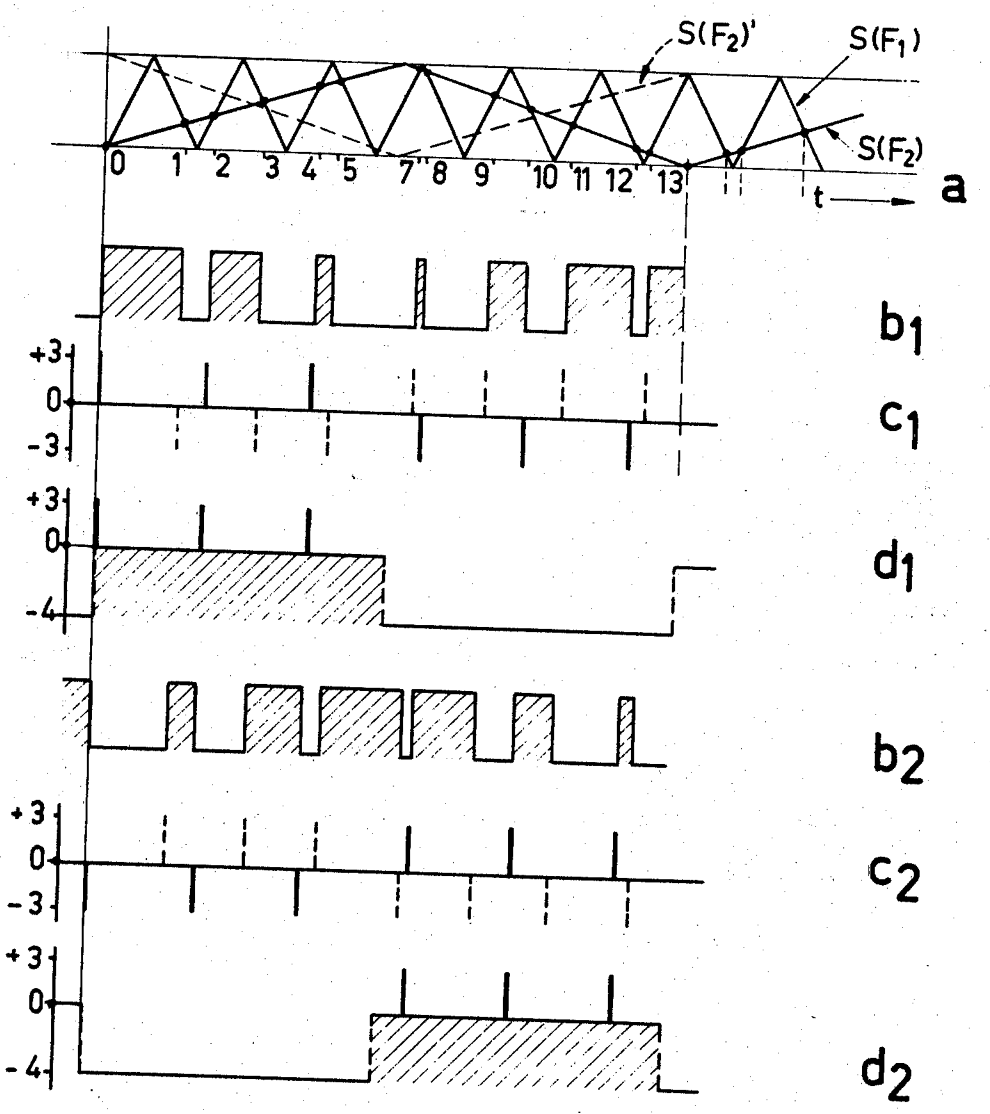

In order that the invention may readily be carried into effect, embodiments thereof will now be described, by way of example, with reference to the accompanying diagrammatic drawings in which FIG. 1 is a block-schematic circuit diagram of an arrangement in accordance with the invention, FIG. 2 shows voltage waveforms illustrating the operation of the arrangement shown in FIG. 1, FIG. 3 shows, by way of example, an arrangement for utilizing the invention and FIG. 4 shows, by way of example, another arrangement for utilizing the invention.

Referring now to FIG. 1, a comparator device includes a difference amplifier V which also acts as a limiter. The difference amplifier V may include, for example, two transistors in a long-tailed pair connection, the bases of the transistors being connected to input terminals 1 and 2 of the difference amplifier V in FIG. 1 and their collector electrodes being connected to output terminals 3 and 4 of the difference amplifier V. One input signal $S(f_1)$ having a frequency $F_1$ is applied to the input 1 of the amplifier and the other input signal $S(F_2)$ having a frequency $F_2$ is applied to the input 2, where it is assumed that $F_2 < F_1$. The two outputs 3 and 4 of the difference amplifier are connected to the inputs of differentiators $D_1$ and $D_2$ respectively, which each may include a differentiating RC network and which each have a capacitor connected between the input and output terminals and a resistor connected between the output terminal and earth. The outputs 5 and 6 of the two differentiators $D_1$ and $D_2$ are connected to the signal inputs of gates $P_1$ and $P_2$ respectively, the control input of each gate being connected to one output of a trigger circuit FF. The signal S $(F_2)$ is also applied through a differentiator $D_3$ to the control input of the trigger circuit FF. The outputs 7 and 8 of the two gates $P_1$ and $P_2$ are interconnected and from their junction the desired mixed signal containing no image frequency is taken.

The operation of the circuit arrangement shown in FIG. 1 will now be described in detail with reference to FIG. 2. FIG. 2a shows the two input signals $S(F_1)$ and $S(F_2)$ as functions of time, the extreme instantaneous values of these signals being assumed to be equal. The slow triangular voltage $S(F_2)$ intersects the fast triangular voltage $S(F_1)$ at instants 0, 1, 2, . . . , 13. At these instants the instantaneous values of the two input signals are equal. A simple calculation shows that the time interval between each two successive even-numbered instants is equal to $(F1 - F_2)^{-1}$, where $(F_1 - F_2)^{-}{}_1$, where $(F_1 - F_2)$ is the difference in frequency of the two input signals $S(F_1)$ and $S(F_2)$. A simple calculation also shows that the time interval between each two successive odd-numbered instants is equal to $(F_1 + F_2)^{-1}$, where $(F_1 + F_2)$ is the sum of the frequencies of the two input signals. FIGS. 2$b_1$ and 2$b_2$ show the output voltages of the difference amplifier V at the terminals 3 and 4 respectively. FIGS. 2$c_1$ and 2$c_2$ show the differentiated pulses at the outputs 5 and 6 of the two differentiators $D_1$ and $D_2$ respectively. In these Figures, the pulses shown by broken lines occur at intervals equal to $(F_1 + F_2)^{-1}$ and the pulses shown by solid lines occur at intervals equal to $(F_1 - F_2)^{-1}$. In order to derive from the comparator device a pulse train in which the time interval between each pair of successive pulses is equal to $(F_1 - F_2)^{-1}$ the two gates $P_1$ and $P_2$ must be controlled so that only during the ascending edges of the slow signal $S(F_2)$ the positive differentiating pulses (FIG. 2$C_1$) from the differentiator $D_1$ are passed, whereas during the descending edges of the slow input signal $S(F_2)$ only the positive differentiated pulses (FIG. 2$c_2$) from the differentiator $D_2$ are passed. To this end, the slow input signal $S(F_2)$ is applied through the differentiator $D_3$ to the control input of a trigger circuit FF. At the outputs of this circuit square-wave voltages (FIGS. 2$d_1$ and 2$d_2$) are produced which have a relative phase difference of 180°. These square-wave voltages are applied to the control inputs of the two gates $P_1$ and $P_2$. The square-wave voltage shown in FIG. 2$d_1$ is applied to the control input of the gate $P_1$ and the square-wave voltage shown in FIG. 2$d_2$ is applied to the control input of the gate $P_2$. Only those differentiated pulses which exceed the zero level shown are passed by the two gates $P_1$ and $P_2$. In FIG. 2$d_1$ the positive pulses from the differentiator $D_1$ are passed by the gate $P_1$ (FIG. 2$c_1$) during the ascending edge of the slow signal $S(F_2)$ and in FIG. 2$d_2$ the positive pulses from the differentiator $D_2$ are passed by the gate $P_2$ (FIG. 2$c_2$) during the descending edge of this slow signal. Thus, pulses having a repetition frequency equal to $(F_1 - F_2)$ appear at the output 9 of the comparator. If now the connections between the control inputs of the two gates $P_1$ and $P_2$ and the two outputs of the trigger circuit FF are interchanged, pulses having a repetition frequency equal to $(F_1 + F_2)$ appear at the output 9 of the comparator, for now the positive pulses (shown by broken lines in FIG. 2$c_2$) will be passed during the ascending edge of the slow signal and the positive pulses (shown by broken lines in FIG. 2$c_1$) will be passed during its descending edge.

Hereinbefore it was assumed that the extreme instaneous values of the input signals are equal or substantially equal. This is obtainable, for example, by changing over adjustable voltage dividers. Alternatively, an automatic gain control circuit which responds to the difference in amplitude may be used to adjust the amplitude of at least one of the signals in a manner such as to reduce the difference in amplitude. However, for satisfactory operation it is not absolutely necessary for the amplitudes to be exactly equal; an excessive difference may result in the absence of desired output pulses. It may be desirable to use a variable amplitude intentionally or to add a modulating signal to one of the input signals in order to produce modulation of the output pulses, especially pulse position modulation.

FIG. 3 shows how from the pulses obtained in the above described manner a sine voltage is obtainable having a frequency equal to the repetition frequency of the pulses. In this Figure, K is the comparator device shown in FIG. 1. The output circuit of the comparator includes the series combination of a trigger circuit F, a frequency doubler T and a band-pass filter B. The pulses from the comparator are applied to the input of the trigger circuit F. At the output of the trigger circuit symmetrical square-wave voltages appear which have a repetition frequency equal to one half of the repetition frequency of the pulses from the comparator. The repetition frequency of these square-wave voltages is multiplied by two in the frequency doubler T so that at the output of this frequncy doubler square-wave voltages appear which have a repetition frequency equal to the repetition frequency of the pulses from the comparators. The square-wave voltages from the frequency doubler are applied to the band-pass filter B. At the output 10 of this band-pass filter a sine voltage is obtained having a frequency equal to the repetition frequency of the pulses from the comparator.

FIG. 4 shows another method of obtaining from the input signals $S(F_1)$ and $S(F_2)$ a sine voltage having a frequency equal to the sum $(F_1 + F_2)$ or the difference $(F_1 - F_2)$ of the frequencies of the input signals. To this end, in this example two identical comparators $K_1$ and $K_2$ are used the outputs of which are interconnected, the common output circuit including the series combination of a trigger circuit F and a band-pass filter B. The input terminals 1 and 1' of the two comparators $K_1$ and $K_2$ are interconnected and the input signal $S(F_1)$ having the higher frequency is applied to the terminals. The input signal $S(F_2)$ is applied directly to the input terminal 2 of the comparator $K_1$ and through a 180° phase shifter P to the input terminal 2' of the comparator $K_2$. Thus, a signal $S(F_2)'$, as shown in FIG. 2$a$ is applied to the input terminal 2' of the comparator $K_2$. Since the operation of the two comparators otherwise is identical, the fact that the slow input signals of the two comparators are shifted 180° in phase means that the output pulses of the comparator $K_1$ will also shifted 180° in phase with respect to the output pulses of the comparator $K_2$. This means that the repetition frequency of the pulses applied to the trigger circuit F is equal to twice the repetition frequency of the output pulses of each of the comparators $K_1$ and $K_2$. At the output of the trigger circuit F a square-wave voltage appears having a repetition frequency equal to the repetition frequency of the pulses from the two comparators $K_1$ and $K_2$. This square-wave voltage is applied to the band-pass filter B. At the output 11 of this band-pass filter a sine voltage is obtained having a frequency equal to the repetition frequency of the output pulses of the comparators $K_1$ and $K_2$.

In the embodiment described with reference to FIG. 2 two triangular input signals $S(F_1)$ and $S(F_2)$ are used. However, the arrangement will also operate with two sinusoidal input signals, but it should be noted that the determination of the points of intersection of the two sinusoidal input signals in the proximity of the extreme values of these signals is less accurate than the determination of the points of intersection of the two triangular input signals in the proximity of their extreme values. If a high degree of accuracy with respect to the determination of the said instants is required, the two sinusoidal input signals are preferably converted, with the aid of a sine-triangle converter, into two triangular signals before they are applied to the two input terminals 1 and 2 of the comparator device shown in FIG. 1.

In the immediately preceding paragraph it has been stated that the mixing arrangement is also suitable for handling sinusoidal input signals. The mixing arrangement is generally suitable for handling input signals of the shape $$S(F_1) = y(t) \times \sin 2\pi \times F_1 \times t$$
$$S(F_2) = y(t) \times \sin 2\pi \times F_2 \times t \qquad (1)$$

where $y(t)$ is an arbitrary function of time which differs from zero at the instants at which $\sin 2\pi F_1 (t) = \sin 2\pi F_2 t$.

What is claimed is:

1. An arrangement for mixing two electric input signals having unequal frequencies without producing image frequencies comprising a comparator device for receiving said input signals and producing output signals only at time periods when the input signals have equal amplitudes and the sign of the product of the signs of the time derivatives of the input signals is constant, said comparator device comprising a difference amplifier having two outputs, first differentiators, gates, a trigger circuit and a second differentiator, said outputs of said difference amplifier each including series combination of said first differentiator and said gate, the output of the two gates being interconnected and the control inputs of the two gates each being connected to an output of said trigger circuit, the control input of said trigger circuit being connected through said second differentiator to that input of the difference amplifier having the lower frequency signal.

2. An arrangement as claimed in claim 1 wherein the time derivatives of the input signals have equal signs.

3. An arrangement as claimed in claim 1 wherein the time derivatives of the input signals have opposite signs.

4. A mixing circuit for producing an output signal without an image frequency signal, comprising a source of first and second input signals, amplitude comparator means connected to said source for producing a train of pulses corresponding to instants at which the instantaneous amplitude of said first and second signals are equal and the sign of the product of the signs of the time derivatives of said first and second input is constant, and trigger circuit means connected to said comparator means for producing, from said trains of pulses, square wave signals, said amplitude comparator means comprise differential amplifier means, means for applying said first and second input signals to said amplifier means, first means for differentiating first and second outputs of said amplifier means to produce said first and second pulse trains, an output terminal, first and second gate means for applying said first and second pulse trains to said output terminals, bistable circuit means having first and second outputs connected to said first and second gate means respectively as control signals, and second differentiating means for applying said second input signal to said bistable circuit, said second input signal having a lower frequency than said first signal.

* * * * *

PO-1050
(5/69)

UNITED STATES PATENT OFFICE
CERTIFICATE OF CORRECTION

Patent No. 3,745,473 Dated July 10, 1973

Inventor(s) GERRIT KLEIN ET AL

It is certified that error appears in the above-identified patent and that said Letters Patent are hereby corrected as shown below:

On the Title Page, Section [75] Inventors:"Karel Elbert" should read --Karel Elbert Kuijk--.

Signed and sealed this 20th day of August 1974.

(SEAL)
Attest:

McCOY M. GIBSON, JR.
Attesting Officer

C. MARSHALL DANN
Commissioner of Patents